United States Patent
Johansson (12)

(10) Patent No.: US 8,912,708 B2
(45) Date of Patent: Dec. 16, 2014

(54) ELECTROMECHANICAL MOTOR

(75) Inventor: Stefan Johansson, Uppsala (SE)

(73) Assignee: PiezoMotor Uppsala AB, Uppsala (SE)

( * ) Notice: Subject to any disclaimer, the term of this patent is extended or adjusted under 35 U.S.C. 154(b) by 433 days.

(21) Appl. No.: 13/379,415

(22) PCT Filed: Jun. 22, 2009

(86) PCT No.: PCT/EP2009/057735
§ 371 (c)(1),
(2), (4) Date: Dec. 20, 2011

(87) PCT Pub. No.: WO2010/149199
PCT Pub. Date: Dec. 29, 2010

(65) Prior Publication Data
US 2012/0098468 A1    Apr. 26, 2012

(51) Int. Cl.
*H02N 2/00* (2006.01)
*H01L 41/09* (2006.01)
*H01L 41/083* (2006.01)
*H02N 2/02* (2006.01)

(52) U.S. Cl.
CPC ............ *H01L 41/0913* (2013.01); *H02N 2/021* (2013.01); *H01L 41/094* (2013.01)
USPC . 310/328; 310/317; 310/323.01; 310/323.02; 310/323.19; 310/330

(58) Field of Classification Search
USPC ............... 310/323.01–323.19, 328, 317, 330
See application file for complete search history.

(56) References Cited

U.S. PATENT DOCUMENTS

| | | | |
|---|---|---|---|
| 4,862,030 A | | 8/1989 | Yokoyama et al. |
| 6,307,301 B1 * | | 10/2001 | Ngo et al. .................... 310/328 |
| 6,392,329 B1 | | 5/2002 | Bryant et al. |
| 6,798,117 B2 | | 9/2004 | Johansson et al. |
| 7,355,325 B2 * | | 4/2008 | Johansson et al. ............ 310/328 |

(Continued)

FOREIGN PATENT DOCUMENTS

| | | |
|---|---|---|
| JP | 044775 A | 1/1992 |
| JP | 2003070267 A | 3/2003 |

(Continued)

OTHER PUBLICATIONS

Jun S H et al: "Piezoelectric linear motor with unimorph structure by co-extrusion process", Sep. 15, 2008, Sensors and Actuators A, pp. 300-303, XP023182828.

(Continued)

*Primary Examiner* — Thomas Dougherty
(74) *Attorney, Agent, or Firm* — Young & Thompson

(57) ABSTRACT

An electromechanical motor includes an actuator assembly and a body to be driven in a driving direction. The actuator assembly has an actuator backing, a first actuator and a second actuator. The actuators are mechanically attached by a respective single attachment to the actuator backing at a first end of the actuators. The actuators have a respective interaction portion constituting a second end opposite to the first end in an actuator direction transverse to the driving direction. The interaction portions are arranged for interaction with an interaction surface of the body by a respective contact area. The actuators include a respective unimorph member arranged for causing a movement of the respective contact area as a response of a respective electrical signal. The respective movements are transverse to the actuator direction, to the driving direction, and to each other.

11 Claims, 8 Drawing Sheets

(56) References Cited

U.S. PATENT DOCUMENTS

| | | | |
|---|---|---|---|
| 7,439,652 B2 * | 10/2008 | Ganor et al. | 310/323.02 |
| 2004/0017134 A1 * | 1/2004 | Ganor | 310/328 |
| 2004/0074300 A1 * | 4/2004 | Karrai et al. | 73/514.34 |
| 2006/0006764 A1 * | 1/2006 | Ganor et al. | 310/328 |
| 2007/0205699 A1 * | 9/2007 | Johansson | 310/332 |

FOREIGN PATENT DOCUMENTS

| | | |
|---|---|---|
| JP | 2004282819 A | 10/2004 |
| JP | 2005033174 A | 2/2005 |
| JP | 2005176579 A | 6/2005 |
| JP | 2006332616 A | 12/2006 |
| JP | 2007144251 A | 6/2007 |
| WO | 2007144251 A1 | 12/2007 |

OTHER PUBLICATIONS

International Search Report, dated Mar. 8, 2010, in PCT/EP2009/057735.

Japanese Office Action, dated Apr. 21, 2014, from corresponding JP application.

* cited by examiner

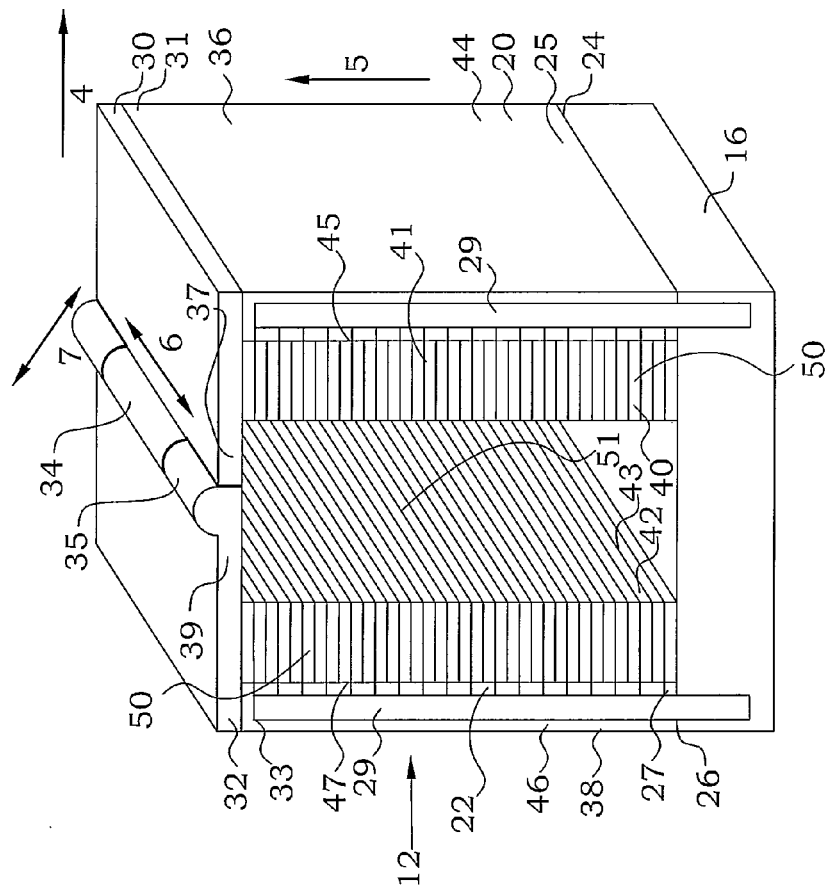
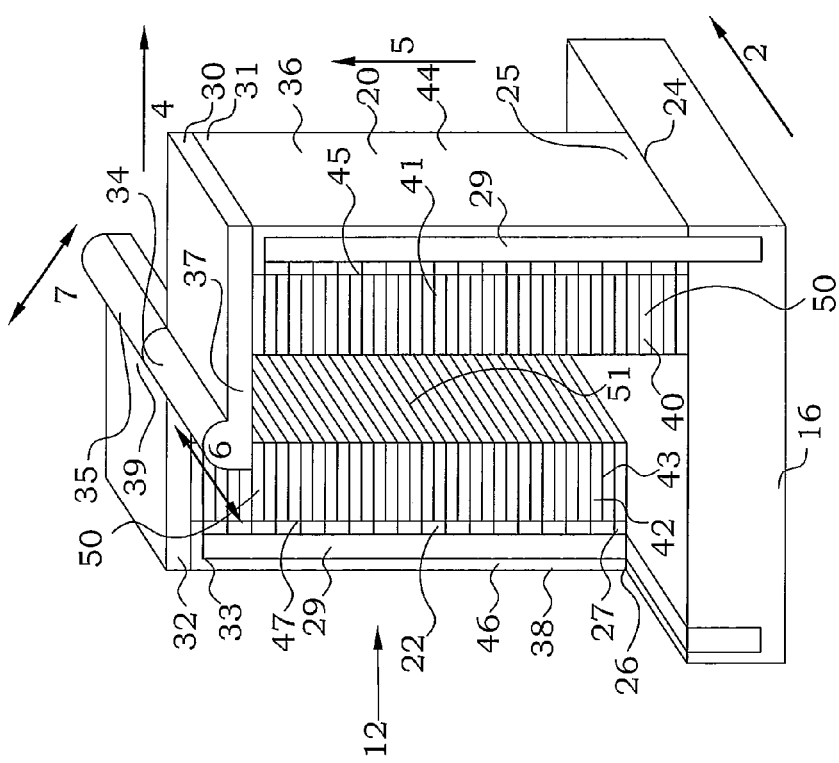
Fig. 6B
Fig. 6A

ELECTROMECHANICAL MOTOR

TECHNICAL FIELD

The present invention relates to electromechanical actuator devices and methods for driving such devices.

BACKGROUND

There are numerous applications with the need for extremely miniaturized motors. For example, in consumer products extremely small, low weight, low power consumption and inexpensive motors are typically requested. The motion range is often in the order of millimeters and with a requested accuracy of micrometers. A number of performance properties are typically requested, e.g. high speed, silent movement, low power consumption, easily controlled positioning and high positioning accuracy, which to some extent are contradictory.

In order to reach highly accurate positioning that at the same time is relatively easily controlled, different motion mechanisms are selected, such as "walking" mechanisms, stick-slip mechanisms, "inertial" positioning or stepping mechanisms. Common for most devices operating according to such principles is that they involve a high degree of static contacting between an actuator and a body to be moved. The position accuracy relies to a large extent on this static contacting. However, the speed is often relatively low, the devices often operate at sub-ultrasonic frequencies, which may make them noisy, and the power efficiency is relatively poor. A typical example of such a device is disclosed in the U.S. Pat. No. 6,798,117.

Such devices can with a proper driving give rise to extremely smooth and thereby quiet motion, and is perfectly suited for many high-demand applications. Devices of this kind are generally based on a relatively complex motion pattern of the used actuators. This requires that several different voltage signals are provided with well defined phase shifts and/or voltage curve shapes. Furthermore, the complex driving pattern also requests large electromechanically activatable volumes producing heat during operation. The deformation of the actuators during operation also induce different kinds of material stress, which eventually may lead to cracking of electrodes, terminations and/or the electromechanically active material itself.

In some applications, however, the smooth motion is not of an equally crucial importance. Instead factors like improvements in speed, durability and complexity reductions are of higher interest.

SUMMARY

An object of the present invention is to provide low complexity miniaturized motors of reasonable speed, high durability while still presenting high-accurate positioning.

The above object is achieved by devices, systems and methods according to the enclosed independent patent claims. Preferred embodiments are defined in the dependent patent claims. In general, according to a first aspect, an electromechanical motor comprises an actuator assembly and a body, relative to which the actuator assembly is to be acting for causing a relative displacement of the body in a driving direction. The actuator assembly has an actuator backing, a first actuator and a second actuator. The first actuator is mechanically attached by a single attachment. The single attachment of the first actuator is a first attachment to the actuator backing. The first attachment is provided at a first end of the first actuator. The first actuator has a first interaction portion constituting a second end of the first actuator. The second end of the first actuator is opposite to the first end of the first actuator in an actuator direction. The second actuator is arranged in an analogue manner with a second attachment and a second interaction portion. The actuator direction is transverse to the driving direction. The first interaction portion and the second interaction portion are arranged for interaction with an interaction surface of the body by a respective contact area. The first actuator and said second actuator comprise a respective unimorph member comprising an electromechanical material arranged between a respective first end and a respective second end of the first actuator and the second actuator. Each of the unimorph members is arranged for causing a movement of a respective contact area as a response of a respective electrical signal. The respective movements are transverse to the actuator direction, transverse to the driving direction, as well as transverse to each other.

According to a second aspect, an electromechanical motor system comprises an electromechanical motor according to the first aspect and a power supply, connected to the electromechanical motor and arranged for providing at least two non-identical electrical signals for excitation of the unimorph members.

According to a third aspect, A method for driving an electromechanical motor having a first interaction portion and a second interaction portion arranged for interacting with a body comprises the step of providing of a first electrical signal for exciting a unimorph member comprising an electromechanical material attached to the first interaction portion and providing of a second electrical signal for exciting a unimorph member comprising an electromechanical material attached to the second interaction portion. The first electrical signal is different from the second electrical signal. The first electrical signal causes the unimorph member of the first interaction portion to move a contact area of the first interaction portion in a first movement direction transverse but not perpendicular to a driving direction. The driving direction is an intended forward travel direction of the body relative to the first interaction portion and the second interaction portion. The second electrical signal causes the unimorph member of the second interaction portion to move a contact area of the second interaction portion in a second movement direction transverse the driving direction. The second movement direction is transverse to the first movement direction. The first electrical signal and the second electrical are arranged for causing at least one of the first interaction portion and the second interaction portion to be in contact with the body during driving.

One advantage with the present invention is that a stepping motion can be achieved by much less complex actuator configurations, and at the same time allow for high speed and long durability.

BRIEF DESCRIPTION OF THE DRAWINGS

The invention, together with further objects and advantages thereof, may best be understood by making reference to the following description taken together with the accompanying drawings, in which:

FIG. 4 is a schematic side view of another embodiment of an electromechanical motor according to the present invention;

FIGS. 5, 6A and 6B are schematic perspective views of further other embodiment of actuator assemblies according to the present invention;

DETAILED DESCRIPTION

Figure 1:
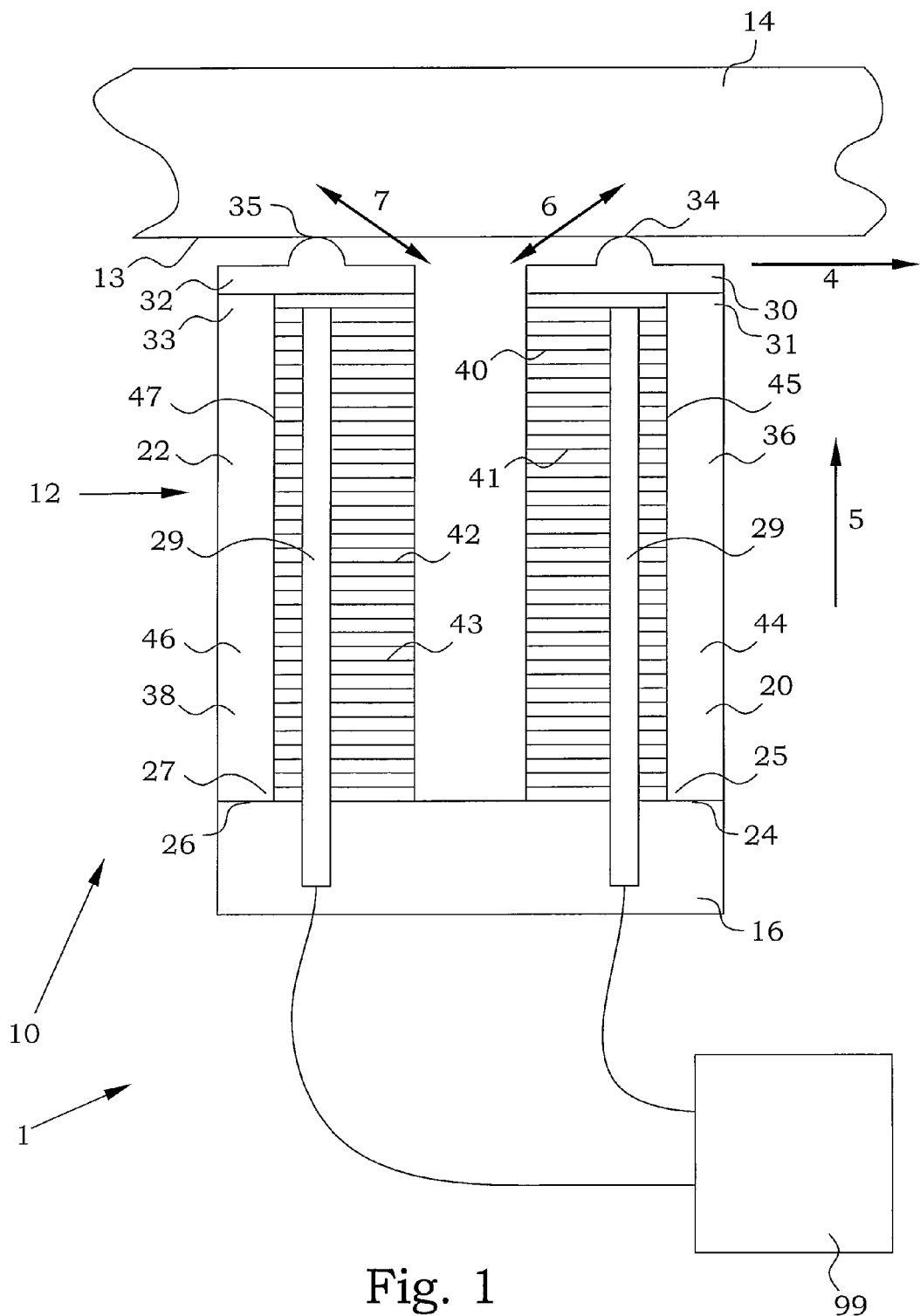
FIG. 1 is a schematic side view of an embodiment of an electromechanical motor system according to the present invention.

Throughout the drawings, the same reference numbers are used for similar or corresponding elements.

The term "transverse" is used in its ordinary wide meaning of lying in a cross-wise direction, i.e. something that crosses something else, not necessarily in a perpendicular fashion. In most cases the term can be assumed as a synonym of "non-parallel".

A set of one-dimensionally moving actuators can with a free end act on a body for achieving a relative moving action. This type of driving mechanism is sometimes referred to as a ciliary motion mechanism due to the similarities to cilia systems in the nature. The one-dimensional motion is typically somewhat inclined with respect to the driving direction, in order to provide also a normal force against the surface to be driven. Ciliary motion may be utilized either in a resonant manner or as a stepping mechanism.

There are many examples of micromechanical system using ciliary motions. E.g. in the article "Fabrication and Operation of Polyimide Bimorph Actuators for a Ciliary Motion System" by M Ataka et, el. in Journal of Microelectromechanical systems, vol. 2, No. 4, December 1993, a micromotion system based on ciliary motion of bimorph thermal actuators is disclosed. In the article "A linear actuator based on cilia vibration" by T. Hatsuzawa in Sensors and Actuators A 105 (2003) pp. 183-189, cilia fibres are excited by external vibrators. However, most such systems have a limited positioning accuracy.

However, according to the present invention, the ciliary motion is suitable to be implemented by electromechanical actuators, e.g. piezoelectric actuators. By having actuators mechanically attached by a single attachment to a backing provides for a firm base. By having the actuators freely movable except for that single attachment and the interaction with the body to be moved creates possibilities to use dimensional changes in electromechanically active volumes of the actuators for creating the requested motion. Since the dimensional changes are essentially immediate and repeatable, very accurate motion patterns can be achieved.

By furthermore utilizing electromechanical actuators comprising unimorph portions, a number of advantages can be achieved. The driving of a unimorph actuator requires only one voltage signal, which means that the complexity in the electronic control is very low. Also, the operation of a unimorph generates a smaller amount of heat compared to a similar bimorph or multimorph structure. This in turn means that the speed can be increased without risking overheating. The unimorph is also efficient to translate a small dimension change of an active volume into a large displacement of the end of the unimorph. At the same time, the unimorph withstands high forces along the actuator, which allows for applying high normal forces.

Some actuator systems based on a ciliary motion are only capable of providing motion in one direction. This is typically cause by the fact that most driving systems utilize pushing or pressing forces against the body to be moved. Arrangements for other types of forces are typically complex to achieve. In order to achieve a possibility to move an object both forwards and backwards, utilizing ciliary motion, at least two actuators with transverse intended motion directions are requested.

An embodiment of an electromechanical motor 10 according to the present invention is illustrated in FIG. 1. The electromechanical motor 10 comprises an actuator assembly 12 and a body 14. The actuator assembly 12 is arranged to be acting on the body 14 for causing a relative displacement of the body 14 and actuator assembly 12 in a driving direction 4. The actuator assembly 12 has an actuator backing 16. The actuator assembly 12 of the present embodiment comprises a first actuator 20 and a second actuator 22. The actuator backing 16 constitutes a support structure for the first actuator 20 and the second actuator 22.

The first actuator 20 is mechanically attached by a single attachment. This single attachment of the first actuator 20 is a first attachment 24 to the actuator backing 16. In other words, the first actuator 20 has only one mechanically permanent connection to the rest of the actuator assembly 12. This configuration allows the first actuator 20 to be freely movable with the first attachment 24 as a reference point. The first attachment 24 is provided at a first end 25 of the first actuator 20.

The first actuator 20 has also a first interaction portion 30 constituting a second end 31 of the first actuator 20. This second end 31 of the first actuator 20 is opposite to the first end 25 of the first actuator 20 as seen in an actuator direction 5. The first interaction portion 30 is arranged for interaction with an interaction surface 13 of the body 14 by a contact area 34. This means that the firm connection to the actuator backing 16 and the contact area 34 against the body 14 are situated at two opposite ends of the first actuator 20, leaving the first actuator without mechanical contacts between these opposite ends, i.e. between the first end 25 and the second end 31. The actuator direction 5 is transverse to the driving direction 4, and the actuator direction 5 is preferably perpendicular or substantially perpendicular to the driving direction 4.

The first actuator 20 comprise a unimorph member 36 comprising an electromechanical material arranged between the first end 25 and the second end 31 of the first actuator 20, and preferably the entire distance or substantially the entire distance between the first end 25 and the second end 31. The unimorph member 36 of this embodiment comprises an active volume 40, exhibiting a change in dimension as a response of electrical signals applied to electrodes 41 electrodes imbedded into the active volume 40. The unimorph member 36 of this embodiment further comprises a passive volume 44 mechanically attached to the active volume 40 along the actuator direction 5. An interface 45 between the active volume 40 and the passive volume 44 thus extends along the entire unimorph member 36 in the actuator direction 5.

The active volume is typically built with electrodes in a multi-layer arrangement to reduce the driving voltage. The standard arrangement is to have electrodes with surfaces in the actuator direction 5, as is shown in FIG. 1. This gives a large stroke since the piezoelectric coefficient, $d_{33}$, for the given orientation is large for piezoceramic materials such as PZT. It is also possible to arrange electrodes in other directions, e.g. in the driving direction 4 or the direction orthogonal to directions 4 and 5. In these cases the $d_{31}$ coefficient gives the strain and while this coefficient is somewhat lower than the $d_{33}$ coefficient, there are still advantages such as higher fracture strength and easier fabrication.

Most actuator materials could be characterised as electromechanical materials, but in the present disclosure we intend materials that change their shape when an electric voltage or current is applied. Typical examples of electromechanical materials are piezoelectric, electrostrictive and antiferroelectric materials and these materials could be single crystalline as well as polycrystalline or amorphous. The materials of greatest interest today are polycrystalline multilayer ferroelectric ceramic materials with large electromechanical strains, but there is an ongoing development of polymer and polymer composite materials that might result in competitive properties. Piezoelectric and electrostrictive materials are at the moment considered as the best candidates.

The unimorph member 36 is arranged for causing a movement of the contact area 34 as a response of an electrical signal applied to the electrodes 41. The active volume 40 changes typically its dimension in the actuator direction when such an electrical signal is applied, but since the active volume 40 is firmly connected to the passive volume 44 along the length of the unimorph member 36, such dimension change instead results in a bending of the unimorph member 36. If the dimension change is a contraction, the unimorph member 36 bends to the left (as illustrated in the FIG. 1), while if the dimension change is an expansion, the unimorph member 36 bends to the right. The contact area 34 will move accordingly and presents therefore a motion path along a first movement direction 6. This first movement direction 6 is transverse to the actuator direction 5 as well as transverse to the driving direction 4. The first movement direction 6 is furthermore non-perpendicular to the driving direction 4, which means that the movement of the contact area 34 has a component in the driving direction 4.

The second actuator 22 is arranged in an analogue manner. In this particular embodiment, the first actuator 20 and the second actuator 22 are arranged mirror symmetrically with respect to each other. The second actuator 22 is therefore also mechanically attached by a single attachment. This single attachment of the second actuator 20 is a second attachment 26 to the actuator backing 16. The second attachment 26 is provided at a first end 27 of the second actuator 22. The second actuator 22 has also a second interaction portion 32 constituting a second end 33 of the second actuator 22. This second end 33 of the second actuator 20 is opposite to the first end 27 of the second actuator 22 as seen in the actuator direction 5. The second interaction portion 32 is arranged for interaction with the interaction surface 13 of the body 14 by a contact area 35.

The second actuator 20 also comprise a unimorph member 38 comprising an electromechanical material arranged between the first end 27 and the second end 33 of the second actuator 22. The unimorph member 38 of this embodiment comprises an active volume 42, exhibiting a change in dimension as a response of electrical signals applied to electrodes 43 electrodes imbedded into the active volume 42. The unimorph member 38 of this embodiment further comprises a passive volume 46 mechanically attached to the active volume 42 along the actuator direction 5. An interface 47 between the active volume 42 and the passive volume 46 thus extends along the entire unimorph member 38 in the actuator direction 5.

The unimorph member 38 is arranged for causing a movement of the contact area 35 as a response of an electrical signal applied to the electrodes 43. If a dimension change of the active volume 42 as a response to the applied electrical signal is a contraction, the unimorph member 38 bends to the right (as illustrated in the FIG. 1), while if the dimension change is an expansion, the unimorph member 38 bends to the left. The contact area 35 will move accordingly and presents therefore a motion path along a second movement direction 7. This second movement direction 7 is transverse to the actuator direction 5 as well as transverse to the driving direction 4. The second movement direction 7 is furthermore non-perpendicular to the driving direction 4, which means that the movement of the contact area 35 has a component in the driving direction 4.

In this particular embodiment the active volume 40 of the first actuator 20 is positioned before the passive volume 44 in the driving direction 4, and the active volume 42 of the second actuator 22 is positioned after the passive volume 46 in the driving direction 4. In this manner, the first movement direction 6 is different from the second movement direction 7. In other words, the first movement direction 6 and the second movement direction 7 are transverse to each other. In the present embodiment, with the mirror symmetry, the second movement direction 7 becomes a mirror direction of the first movement direction 6 with respect to a mirror plane parallel to the actuator direction 5. In other embodiments, the relative positions of the active and passive volumes can be the opposite, as described further below.

The active volumes 40, 42 are, as described above, activated by providing electrical signals. To this end, an electromechanical motor system 1 comprising the electromechanical motor 10 also comprises a power supply 99, connected to the electromechanical motor 10 and arranged for providing at least two non-identical electrical signals for excitation of the unimorph members 36, 38.

These one-dimensional movements of the contact areas of the actuators can easily be combined with relatively simple electrical signals into an arrangement operating according to a ciliary motion principle, or more precisely a double ciliary motion principle. FIGS. 2A-D schematically illustrates one embodiment of such a drive mechanism. Note that the dimension changes of the unimorphs are extremely exaggerated in the figure, and thereby also the bending strokes, in order to clearly illustrate the basic principles. In practice, the dimension changes and bending strokes are very small compared to the total actuator dimensions.

Figure 2A:
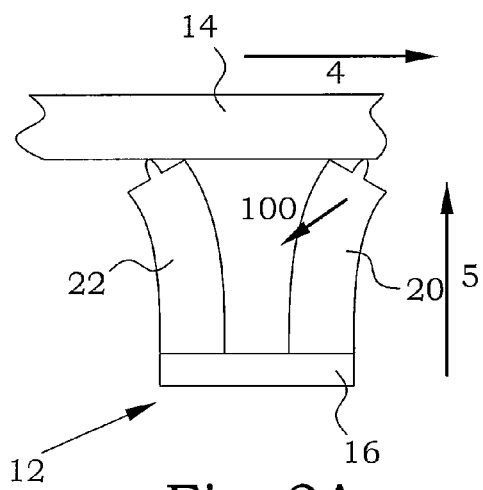
FIGS. 2A-D are schematic illustrations of an embodiment of a ciliary motion.
Figure 2B:
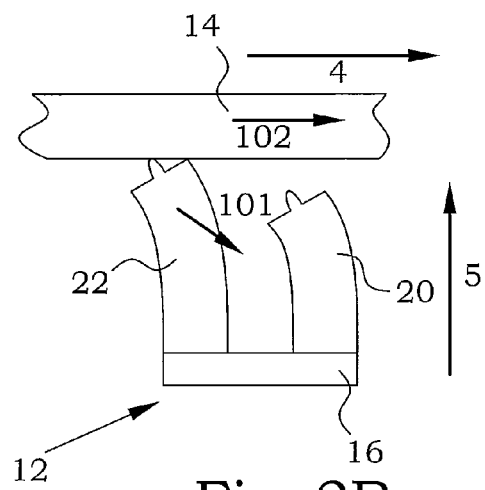

In FIG. 2A, both active volumes are given electrical signals causing an expansion in the actuator direction. This causes both actuators 20, 22 to bend outwards from each other. The body 14 is in contact with both actuators 20, 22. From this position, the first actuator 20 is caused to bend back. The entire length of the first actuator 20 is also reduced, i.e. the contact area moves in the direction indicated by the arrow 100. This releases the tip of the first actuator 20 from the body 14, but the body 14 itself does not move, since it is supported by the second actuator 22. When the contraction of the active volume of the first actuator 20 is ended, the first actuator is instead bent to the left, and with a shorter length, as illustrated in FIG. 2B. From this situation, also the second actuator 22 is allowed to bend back and the contacting area of the second actuator 22 moves along the arrow 101. Since the body 14 only is supported by the second actuator 22, the body 14 follows in this motion and is thereby provided with a motion component in the driving direction, as illustrated by arrow 102. We here assume that there is a normal force holding the body 14 and the actuator assembly 12 together.

Figure 2C:
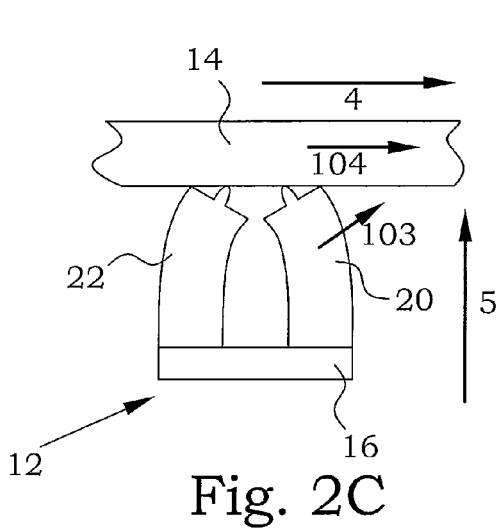
Figure 2D:
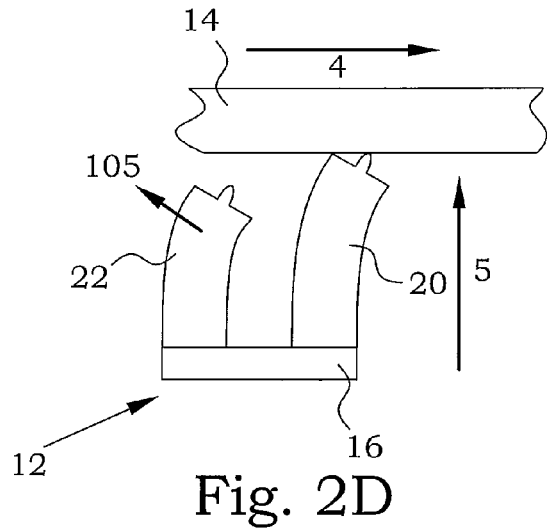

When the bending of the second actuator 22 is ended, the situation as illustrated in FIG. 2C is achieved. The body 14 is again in contact with both actuators 20, 22. The first actuator 20 is now given electrical signals causing the unimorph of the first actuator to once more bend in the direction indicated by the arrow 103. This motion also removes the contact between the second actuator 22 and the body 14. The body thereby follows the first actuator 20 in its motion and is thereby given a motion component 104 in the driving direction. The situation of FIG. 2D is eventually reached. Here the second actuator 22 is caused to bend again for retrieving its original position from FIG. 2A, by the motion 105. The situation of FIG. 2A is again achieved, however, now with the body moved a certain distance in the driving direction.

In such a way, a driving action can be achieved. By reversing the application of the electrical signals, the driving action can also be provided in the opposite direction.

Figure 3A:
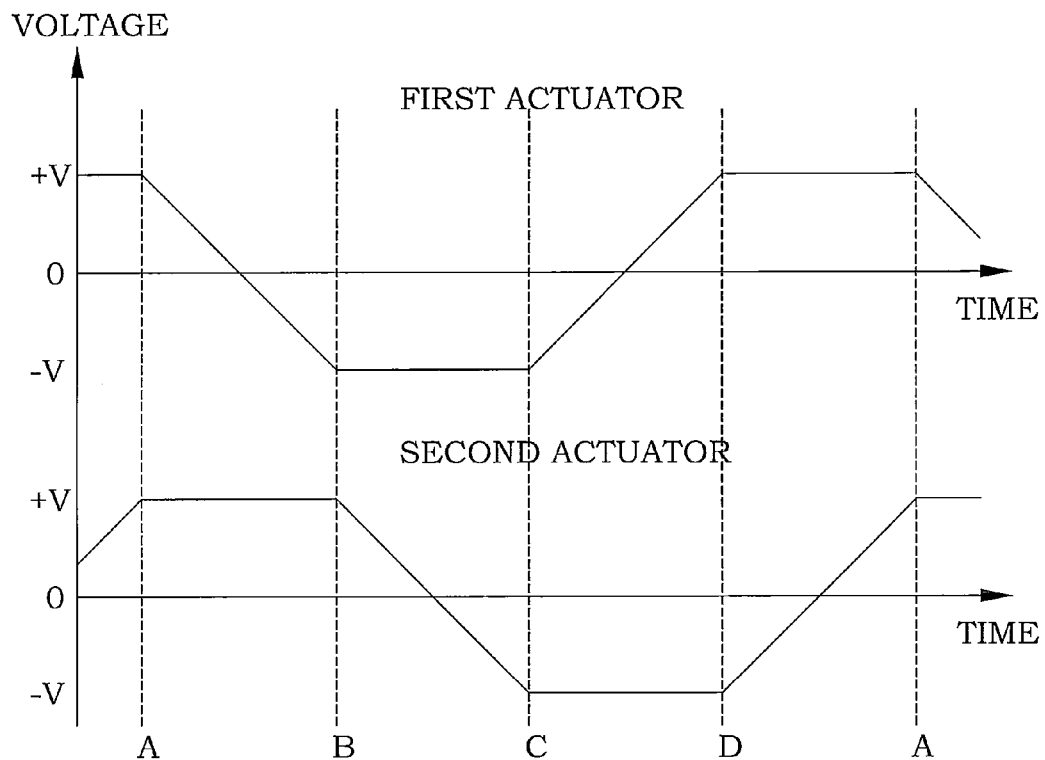
FIGS. 3A-D are diagrams showing embodiments of voltage signals for achieving a ciliary motion.

In FIG. 3A, two voltage curves are illustrated as an embodiment of how the driving voltages of the first and second actuator may look like. The upper one refers to the voltage applied over the first actuator of FIGS. 2A-D and the lower one refers to the voltage applied over the second actuator. A positive voltage is here assumed to cause an expansion of the active volume, and a negative voltage is assumed to cause a contraction of the active volume. The letters below the time axis refers to the different situation of FIGS. 2A-D. A single voltage curve, phase shifted 90 degrees between the two actuators can thus be used for causing a stepping action. A minor disadvantage with such an embodiment is that the body is only actively driven during half the period (between B and D), while is it standing still the rest of the time (between A and B and between D and A).

Figure 3B:
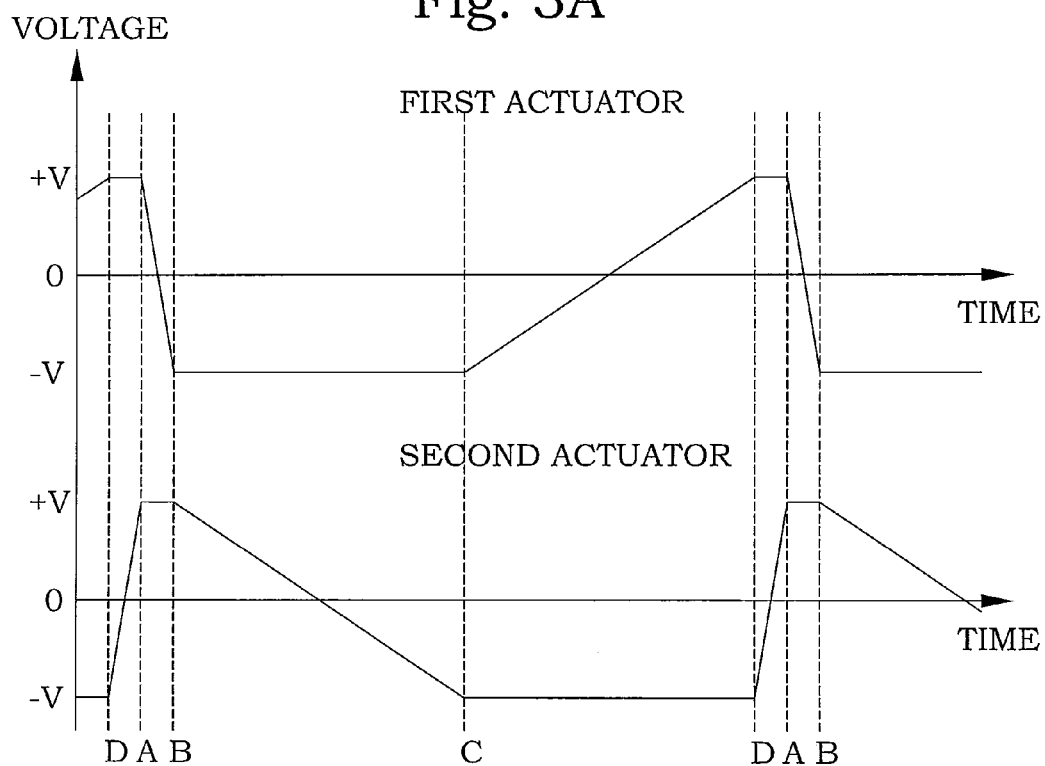

FIG. 3B illustrates another embodiment of driving voltages. Here the times between the situations A-D are modified so that the periods when the body is at rest are reduced and optionally the active moving periods can be increased. A faster or at least smoother movement of the body is achieved. In such a case, however, it is no longer possible to use an identical shape of the voltages to the different actuator. Instead separate curve shapes have to be provided.

Figure 3C:
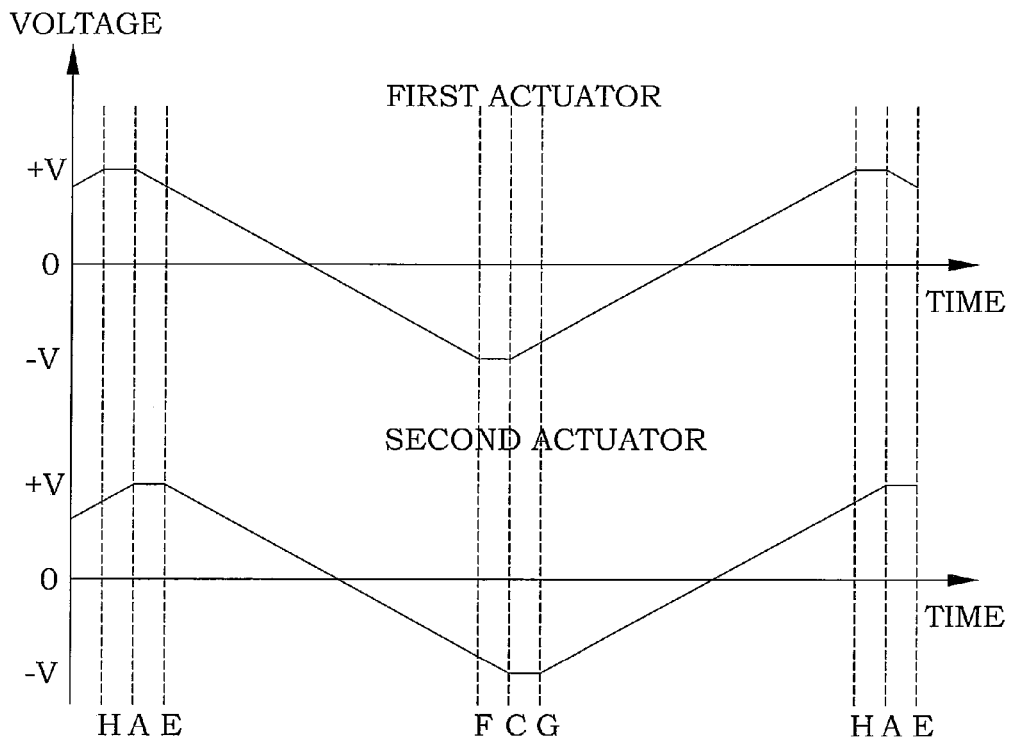

FIG. 3C illustrates yet another embodiment of driving voltages. These voltages cause a double ciliary motion with the actuators described before, however, in a slightly different manner as what is illustrated in FIGS. 2A-D. The situations of FIGS. 2B and 2D will actually not be reached. In this embodiment, the operation of contracting the second actuator starts just a short while, at time E, after the contraction of the first actuator starts. When the first actuator reaches its most contracted state at time F, the second actuator is also almost fully contracted. The body will nevertheless be in contact with only the second actuator until the situation of FIG. 2C is reached. The first actuator starts to expand and takes over the contact to the body. At time G, also the second actuator starts to expand and when the first actuator reaches its most expanded state at time H, the second actuator is also almost fully expanded. The period during which the body is at rest is limited to the time between H and E of the following cycle.

Figure 3D:
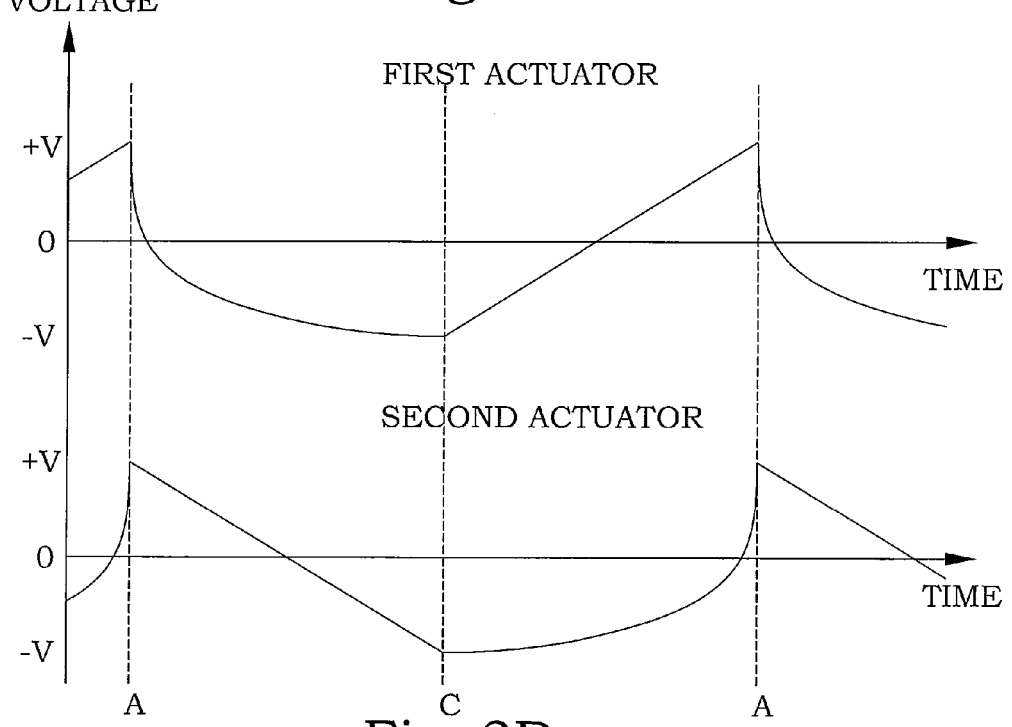

FIG. 3D illustrates another embodiment of a similar theme. Here the voltages are optimized to give a minimum resting time. The person skilled in the art realizes that there are numerous variations of how to apply the voltages to achieve a double ciliary motion. Even phase shifted simple wave forms, such as sinusoidal or triangular voltage curves can be used. In some such cases, the motion of the body may be somewhat strange, with parts of reciprocal motion periods, but may nevertheless be used to achieve a net motion in a pre-determined direction.

Here above, the described motion patterns are achieved using unimorphs, i.e. members having an electromechanically passive part integrated in one and the same piece as an electromechanically active part. The same kind of motion pattern would also be possible to achieve by more elaborate actuators, such as e.g. bimorphs, having two mechanically connected active parts. However, such arrangements are more complex to drive and do not provide all the stability advantages as the unimorphs do, see the description further below. Therefore, unimorphs are the presently preferred building block for the ideas of the present invention.

The use of unimorphs has certain advantages, in particular if the actuator direction is perpendicular or essentially perpendicular to the driving direction. The passive parts of the actuator provide a rigid support for even relatively high normal forces between the actuator assembly and the body. At the same time, the very same members are the members causing the movement that is parallel to neither the actuator direction nor the driving direction. Further advantages of further preferred embodiments are presented here below.

Figures 4, 5:
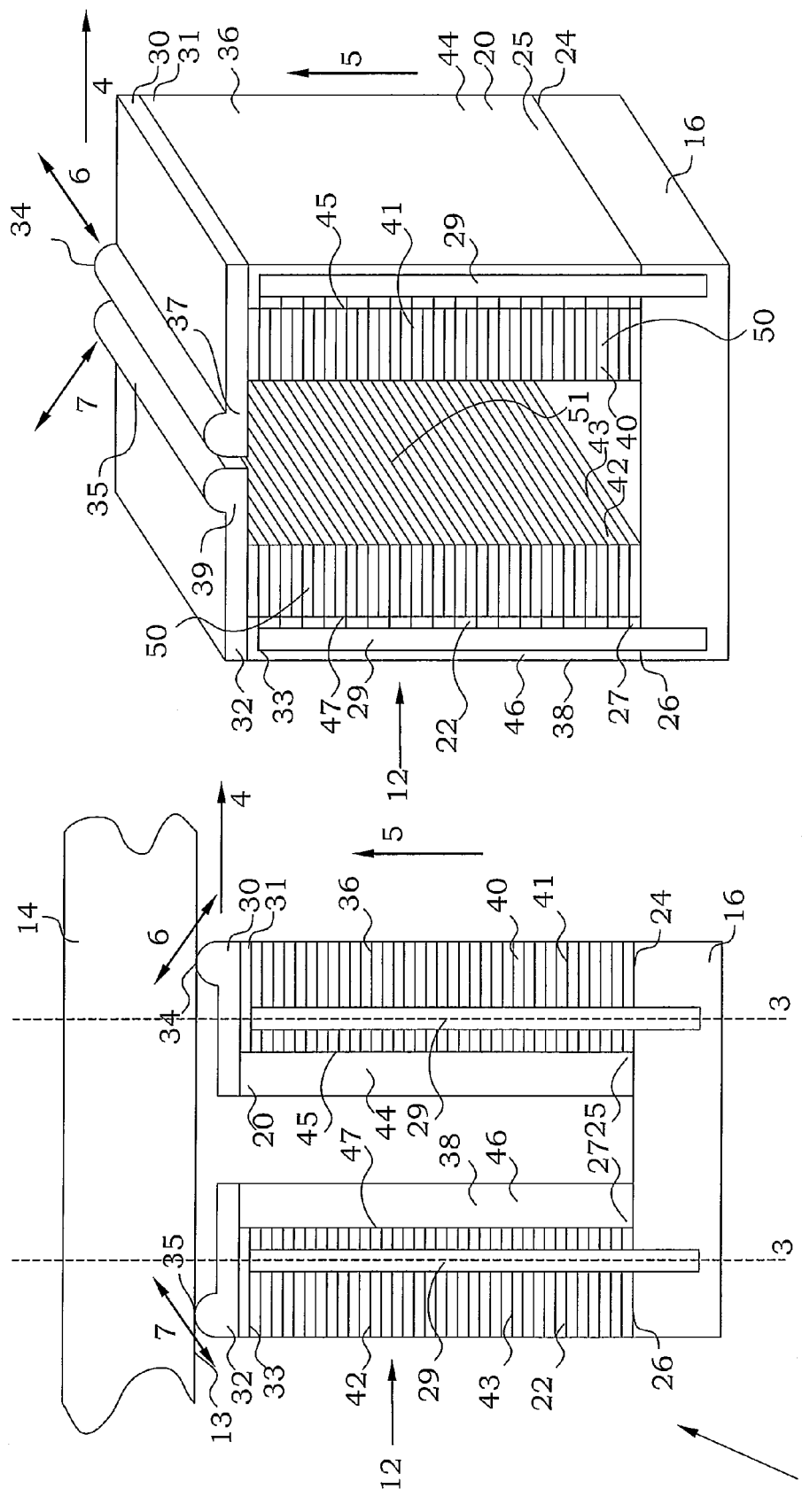

In the embodiment of FIG. 1, the active volumes of the actuators are facing each other, which means that the first and second movement directions 6, 7 associated with an expansion of the active volumes are directed from each other. The opposite is of course also possible, as illustrated by FIG. 4. Here the active volumes 40, 42 of the actuators 20, 22 are facing away from each other. This results in that the first and second movement directions 6, 7 also are directed in mirror symmetrical directions compared with what is the situation in FIG. 1.

In FIG. 4, the contact areas 34, 35 of the interaction portions 30, 32 are provided close to the outer edge of the respective actuator 20, 22. In other words, the contact areas are situated offset in a direction along the driving direction 4 from a centre line 3 of respective actuator to 20, 22, to which it is attached. This arrangement has the advantage that an increased levering action is achieved. The positions at which the contact areas 34, 35 are positioned present a larger stroke than a contact area positioned at the centre line 3. In such a manner, the step size of each cycle can be increased, which also increases the maximum achievable speed.

This property is further developed in FIG. 5, where the interaction portions 30, 32 are allowed to extend outside the main actuator cross-section. The first interaction portion 30 has a protruding portion 37, protruding outside the first actuator 20 in a direction along the driving direction 4, in this case opposite to the indicated driving direction 4. The contact area 34 of the first interaction portion 30 is provided at that protruding portion 37. Similarly, the second interaction portion 32 has a protruding portion 39, protruding outside the second actuator 22 in a direction along the driving direction 4, in this case opposite to the indicated driving direction 4. The contact area 35 of the second interaction portion 30 is provided at that protruding portion 39. In such an embodiment, the levering action is further increased. However, at the same time, the ability to withstand normal forces will be reduced, since the normal force will act outside the cross-section of the main actuator, which means that the normal force will give rise to a bending torque.

In FIG. 5, it can also be seen that the width of the actuator in the direction of the driving direction 4 is kept relatively small, while the width in a cross direction 2 perpendicular to both the driving direction 4 and the actuator direction 5 is relatively large. Such a shape increase the possible bending of the actuators, which together with the protruding portions 37, 39 give rise to very large possible steps.

Another feature that preferably can be utilized for further increasing the efficiency is the design of the electrodes 41, 43. In many applications using multilayer techniques for achieving e.g. bimorph structures, the electrodes are "hidden" within the active volume in order to connect one of the electrodes, either the phase or ground electrode, with the termination electrode 29 without causing short-circuits. This is usually called an interdigital electrode arrangement. The problem with this is that the dimension changes in this outer in-active layer causes large tensile stresses that increase the risks for cracks at the actuator surfaces. These cracks are typically appearing at positions where terminations are provided, which may cause failure of the actuators or terminations.

At the contrary, in the present disclosure, in embodiments when passive volumes 44, 46 are available in the actuators 20, 22, the surfaces of the passive volumes 44, 46 can be utilized for providing terminations 29, by which the electrodes 41, 43 are electrically connected. Here the risk for cracks is lower, in particular in the vicinity of the middle of the passive volume 44, 46. By providing the terminations 29 at the passive volumes 44, 46, the electrodes 41, 43 can in many applications be allowed to extend all the way out to at least one outer surface of the active volume, and preferably to all outer surfaces. In particular, the electrodes can extend 41, 43 out to at least one of a surface 51 of the active volume 40, 42 facing away from the corresponding passive volume 44, 46, and a surface 50 of the active volume 40, 42 along the driving direction 4. The provision of the electrodes the entire way out to the surface of the active volume 40, 42 has two main advantages. First, a larger volume of the electromechanically active material can be utilized for causing a motion. Secondly, any inactive layer of material outside the electrodes will counteract any shape changes of the active volume, and the reduction of such zones also makes the motion more efficient.

In a typical application, the body is at least partially supported by some bearing arrangement. It is then of great importance to have the contact areas well aligned with the interaction surface 13 at the instants when both contact areas 34, 35 are in contact with the body 14. This occurs typically at minimum and maximum strokes. If the alignment is poor, there is a risk that only one of the contact areas 34, 35 is in contact with the body, and the transfer of contact between the two contact areas 34, 35 will not take place according to the intended schedule. A very accurate alignment of the interaction surface 13 of the body 14 might therefore be necessary in a general case.

In an embodiment, illustrated in FIG. 6A, such alignment requirements are no longer so strict. In this embodiment, both the first actuator 20 and the second actuator 22 are provided with respective interaction portions 30, 32 having protruding portions 37, 39. The contact area 34 of the interaction portion 30 of the first actuator 20 is here aligned with the contact area 35 of the interaction portion 32 of the second actuator 22 in the cross direction 2. If the interaction surface 13 of the body is somewhat inclined from the intended perpendicular configuration, the same height differences will be experienced by both interaction surfaces. This in turn means that any handing-over procedures between the contact areas 34, 35 will proceed just as planned without disturbances.

FIG. 6B illustrates another embodiment presenting a similar alignment robust configuration of the contact areas 34, 35. Here, the contact area 34 of the first interaction portion 30 and the contact area 35 of said second interaction portion 32 comprise respective part contact areas, being interleaved with each other in the cross direction 2.

Figure 7:
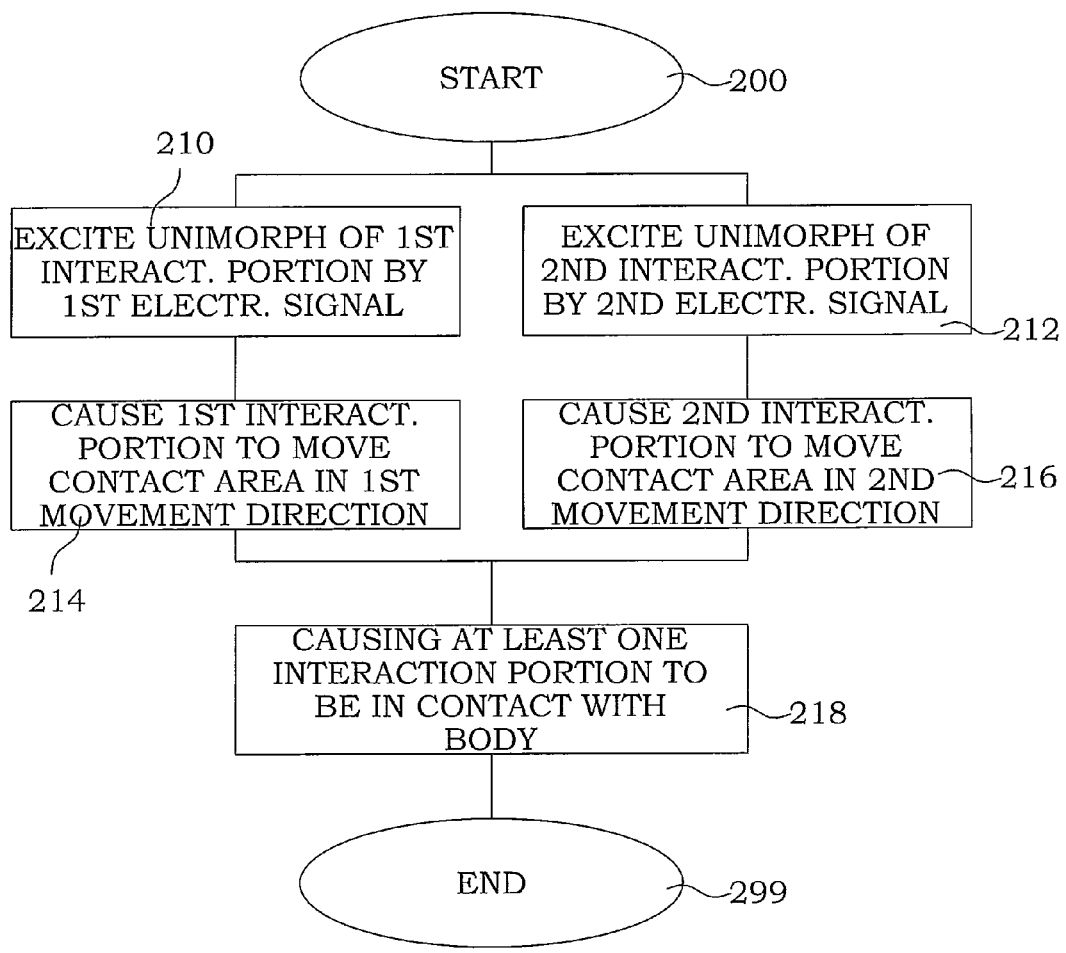
FIG. 7 is a flow diagram of steps of an embodiment of a method according to the present invention.

FIG. 7 illustrates a flow diagram of steps of an embodiment of a method according to the present invention. The method for driving an electromechanical motor having a first interaction portion and a second interaction portion arranged for interacting with a body is started in step 200. In step 210, a first electrical signal for exciting a unimorph member attached to said first interaction portion is provided. In step 212, a second electrical signal for exciting a unimorph member attached to said second interaction portion is provided.

The steps 210 and 212 are performed simultaneously and in typically in cooperation. The first electrical signal is different from the second electrical signal. The first electrical signal causes in step 214 the unimorph member of the first interaction portion to move a contact area of the first interaction portion in a first movement direction transverse but not perpendicular to a driving direction. The driving direction is an intended forward travel direction of the body relative to the first interaction portion and the second interaction portion. Similarly the second electrical signal causes in step 216 the unimorph member of the second interaction portion to move a contact area of the second interaction portion in a second movement direction transverse the driving direction. The second movement direction is transverse also to the first movement direction. The first electrical signal and the second electrical are arranged for causing, in step 218, at least one of the first interaction portion and the second interaction portion to be in contact with the body during driving. The procedure ends in step 299.

Figure 8:
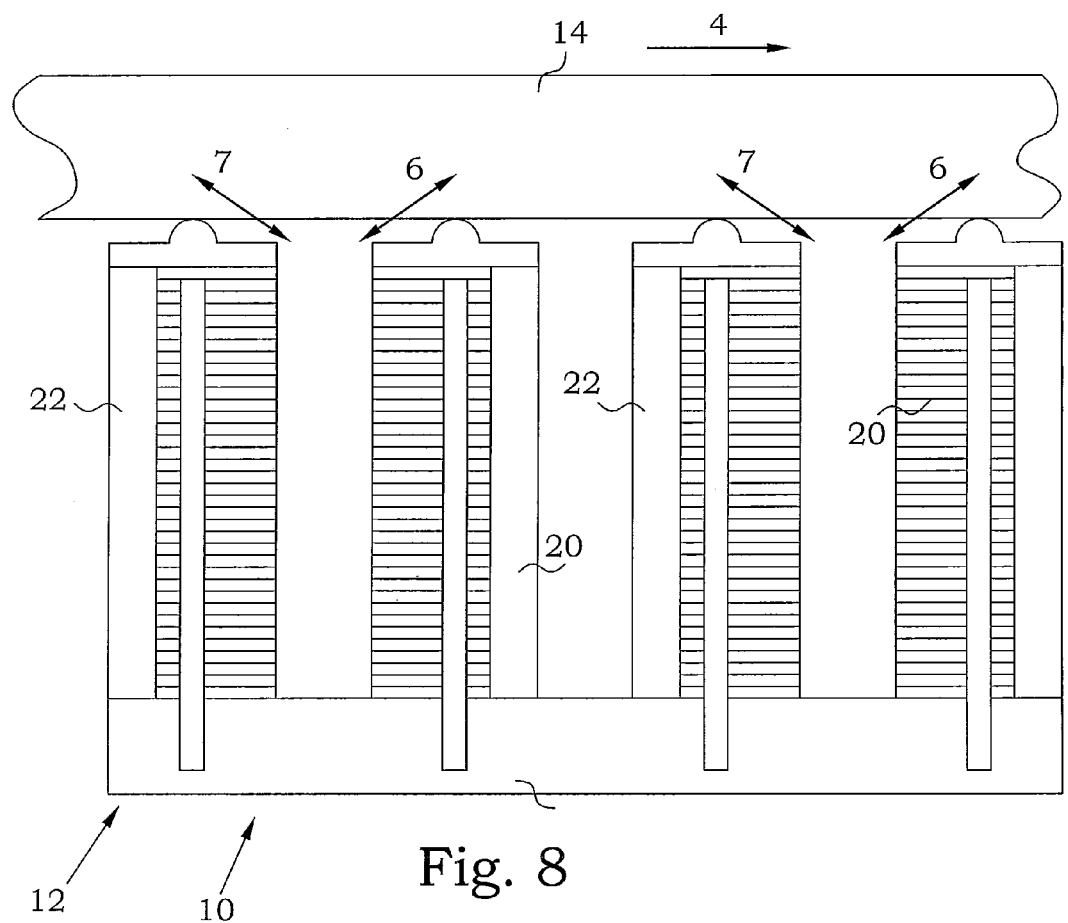
FIGS. 8 and 9 are schematic side views of further other embodiment of electromechanical motors according to the present invention.

There are many different possible variations of the double ciliary motion motor presented in the present disclosure. It is e.g. not limited to have just two actuators. Also multiple-actuator solutions are possible. FIG. 8 illustrates one embodiment of an electromechanical motor having four actuators. In this embodiment, the actuators are electrically connected in two pairs, thereby providing a corresponding motion scheme as described above. The cooperating actuators can be placed in any configuration with respect to each other, preferably selected dependent on the intended application. In the present embodiment, all four actuators are placed in a line. However, configurations of actuators provided at different two-dimensional positions are also possible. When the different groups of actuator pairs are operating out of phase with each other a smoother movement can be achieved.

Figure 9:
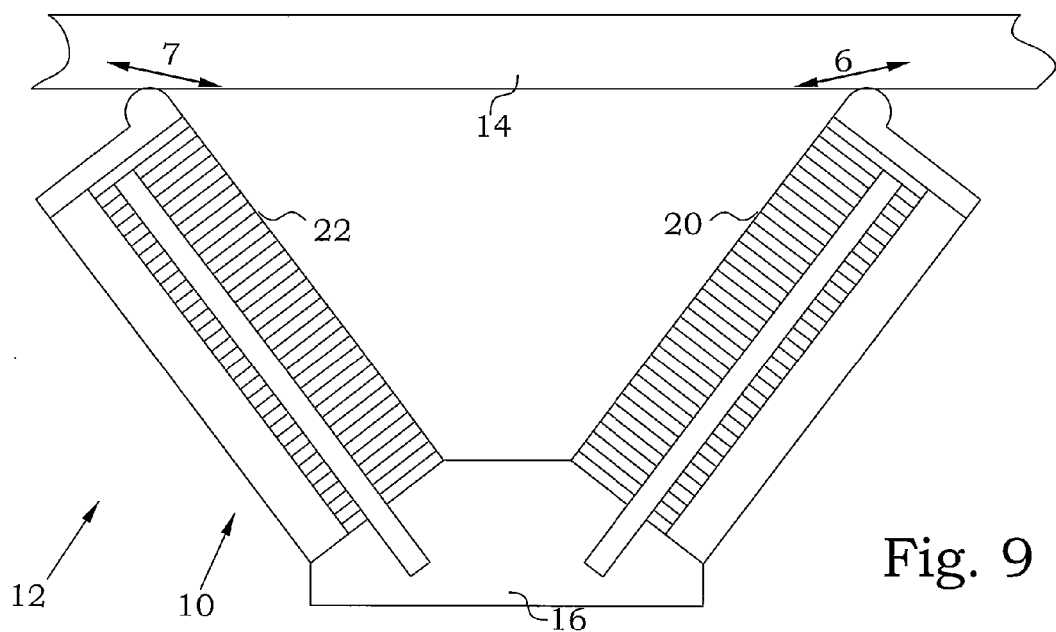

In the above embodiments, the actuators are illustrated in a perpendicular relation to the interaction surface of the body. As mentioned above, this gives advantages in terms of loads. However, in other applications, e.g. where the load is very small, other geometrical configurations are also possible. An embodiment of FIG. 9 illustrates an electromechanical motor having two non-parallel actuators, which furthermore are non-perpendicular to the interaction surface 13. In this manner it is possible to use also geometrical design for determine the inclining angle between the movement directions 6, 7 of the contact areas 34, 35 and the driving direction 4.

By having access to more than one pair of actuators, it is also possible to achieve motion in more than one direction. One pair of actuators can then be used for moving the object in a first driving direction, while another pair of actuators can be used for moving the object in a transversal driving direction. The unimorphs are then aligned in the intended driving direction.

Another possibility to achieve a two-dimensional motion is to provide the actuators with a bimorph structure in the cross section. Such an embodiment is illustrated in FIG. 10. The active volume of each actuator is divided in two part active volumes in the cross direction 2. The part active volumes are arranged to be excited by separate electrical signals. If the signals are different, this will result in a bending of the actuators in the cross direction 2. By adapting the electrical signals, a motion in a direction transverse to the driving direction can thus be allowed.

The embodiments described above are to be understood as a few illustrative examples of the present invention. It will be understood by those skilled in the art that various modifications, combinations and changes may be made to the embodiments without departing from the scope of the present inven-

The invention claimed is:

1. An electromechanical motor, comprising:
an actuator assembly;
a body, relative to which said actuator assembly is to be acting for causing a relative displacement of said body in a driving direction;
said actuator assembly having an actuator backing, a first actuator and a second actuator;
said first actuator is mechanically attached by a single attachment;
said single attachment of said first actuator is a first attachment to said actuator backing, said first attachment being provided at a first end of said first actuator;
said first actuator having a first interaction portion constituting a second end of said first actuator, said second end of said first actuator being opposite to said first end of said first actuator in an actuator direction;
said second actuator is mechanically attached by a single attachment;
said single attachment of said second actuator is a second attachment to said actuator backing, said second attachment being provided at a first end of said second actuator;
said second actuator having a second interaction portion constituting a second end of said second actuator, said second end of said second actuator being opposite to said first end of said second actuator in said actuator direction;
said actuator direction being transverse to said driving direction;
said first interaction portion and said second interaction portion being arranged for interaction with an interaction surface of said body by a respective contact area;
said first actuator and said second actuator comprise a respective member comprising an electromechanical material arranged between a respective said first end and a respective said second end of said first actuator and said second actuator;
each of said members that comprises an electromechanical material being arranged for causing a one-dimensional movement forth and back of a respective said contact area as a response of a respective single electrical signal; and
said respective one-dimensional movements are transverse to said actuator direction, transverse to said driving direction, as well as transverse to each other;
each of said members that comprises an electromechanical material comprises an active volume, exhibiting a change in dimension as a response of said single electrical signal applied thereto, and a passive volume mechanically attached to a respective said active volume along said actuator direction;
said active volume of said first actuator is positioned before said passive volume in said driving direction; and
said active volume of said second actuator is positioned after said passive volume in said driving direction.

2. The electromechanical motor according to claim 1, wherein:
at least one of said active volume of said first actuator and said active volume of said second actuator comprises electrodes for exciting said active volume imbedded into said active volume;
said electrodes extending out to at least one of:
a surface of said active volume facing away from said passive volume attached to the active volume; and
a surface of said active volume along said driving direction.

3. The electromechanical motor according to claim 2, wherein said electrodes are electrically connected to terminations provided at a surface of said passive volume.

4. The electromechanical motor according to claim 1, wherein at least one contact area of said first interaction portion and said second interaction portion is situated offset in a direction along said driving direction from a center line of respective said actuator to which it is attached.

5. The electromechanical motor according to claim 4, wherein at least one of said first interaction portion and said second interaction portion has a protruding portion, protruding outside the respective actuator to which it is attached in a direction along said driving direction.

6. The electromechanical motor according to claim 5, wherein said contact area of said at least one of said first interaction portion and said second interaction portion is provided at said protruding portion.

7. The electromechanical motor according to claim 5, wherein both said first interaction portion and said second interaction portion has a respective said protruding portion.

8. The electromechanical motor according to claim 7, wherein said contact area of said first interaction portion is aligned with said contact area of said second interaction portion in a cross direction, perpendicular to said driving direction.

9. The electromechanical motor according to claim 8, wherein said contact area of said first interaction portion and said contact area of said second interaction portion comprise respective part contact areas, being interleaved with each other.

10. An electromechanical motor system comprising:
an electromechanical motor having
an actuator assembly,
a body, relative to which said actuator assembly is to be acting for causing a relative displacement of said body in a driving direction,
said actuator assembly having an actuator backing, a first actuator and a second actuator,
said first actuator is mechanically attached by a single attachment,
said single attachment of said first actuator is a first attachment to said actuator backing, said first attachment being provided at a first end of said first actuator,
said first actuator having a first interaction portion constituting a second end of said first actuator, said second end of said first actuator being opposite to said first end of said first actuator in an actuator direction,
said second actuator is mechanically attached by a single attachment,
said single attachment of said second actuator is a second attachment to said actuator backing, said second attachment being provided at a first end of said second actuator,
said second actuator having a second interaction portion constituting a second end of said second actuator,
said second end of said second actuator being opposite to said first end of said second actuator in said actuator direction,
said actuator direction being transverse to said driving direction, said first interaction portion and said second interaction portion being arranged for interaction with an interaction surface of said body by a respective contact area, said first actuator and said second actuator comprise a respective member comprising an electromechanical material arranged between a respective said first end and a respective said second end of said first actuator and said second actuator, each of said members that comprises an electromechanical material being arranged for causing a one-dimensional movement forth and back of a respective said contact area as a response of a respective single electrical signal, said respective one-dimensional movements are transverse to said actuator direction, transverse to said driving direction, as well as transverse to each other, each of said members that comprises an electromechanical material comprises an active volume, exhibiting a change in dimension as a response of said single electrical signal applied thereto, and a passive volume mechanically attached to a respective said active volume along said actuator direction, said active volume of said first actuator is positioned before said passive volume in said driving direction, and said active volume of said second actuator is positioned after said passive volume in said driving direction; and a power supply, connected to said electromechanical motor and arranged to provide at least two non-identical electrical signals for excitation of said members that comprise an electromechanical material.

11. A method for driving an electromechanical motor having a first interaction portion and a second interaction portion arranged for interacting with a body, said method comprising the steps of:

providing a first electrical signal for exciting a member comprising an electromechanical material attached to said first interaction portion; and providing a second electrical signal for exciting a member comprising an electromechanical material attached to said second interaction portion;

said first electrical signal is different from said second electrical signal;

each of said members that comprises an electromechanical material comprises an active volume that exhibits a change in dimension as a response to said first and second electrical signals respectively applied thereto, and a passive volume mechanically attached to a respective said active volume along an actuator direction;

said first electrical signal and said second electrical being arranged for causing at least one of said first interaction portion and said second interaction portion to be in contact with said body during driving;

said first electrical signal causes said member that comprises an electromechanical material of said first interaction portion to move a contact area of said first interaction portion forth and back in a first one-dimensional movement direction transverse but not perpendicular to a driving direction, said driving direction being an intended forward travel direction of said body relative to said first interaction portion and said second interaction portion; and said second electrical signal causes said member that comprises an electromechanical material of said second interaction portion to move a contact area of said second interaction portion forth and back in a second one-dimensional movement direction transverse to said driving direction, said second one-dimensional movement direction being transverse to said first one-dimensional movement direction.

* * * * *